(12) United States Patent
Li et al.

(10) Patent No.: US 10,109,941 B1
(45) Date of Patent: Oct. 23, 2018

(54) STEPPED SLOT CONNECTOR TO ENABLE LOW HEIGHT PLATFORMS

(71) Applicant: INTEL CORPORATION, Santa Clara, CA (US)

(72) Inventors: Xiang Li, Portland, OR (US); George Vergis, Portland, OR (US)

(73) Assignee: INTEL CORPORATION, Santa Clara, CA (US)

(*) Notice: Subject to any disclaimer, the term of this patent is extended or adjusted under 35 U.S.C. 154(b) by 0 days.

(21) Appl. No.: 15/640,394

(22) Filed: Jun. 30, 2017

(51) Int. Cl.
| | | |
|---|---|---|
| *H01R 12/70* | (2011.01) | |
| *H01R 12/73* | (2011.01) | |
| *H01R 13/66* | (2006.01) | |
| *H01R 43/26* | (2006.01) | |

(52) U.S. Cl.
CPC ......... *H01R 12/737* (2013.01); *H01R 13/665* (2013.01); *H01R 13/6616* (2013.01); *H01R 43/26* (2013.01); *H01R 12/7023* (2013.01); *H01R 12/7058* (2013.01)

(58) Field of Classification Search
CPC  H01R 13/66; H01R 13/6608; H01R 13/6616; H01R 13/665; H01R 13/6658; H01R 12/7023; H01R 12/7058; H01R 12/737; H01R 43/26; H05K 3/366
See application file for complete search history.

(56) References Cited

U.S. PATENT DOCUMENTS

| | | | | |
|---|---|---|---|---|
| 4,985,870 A | * | 1/1991 | Faraci ...................... | G11C 5/00 273/148 B |
| 5,035,631 A | * | 7/1991 | Piorunneck .......... | H01R 23/688 439/108 |
| 5,650,917 A | * | 7/1997 | Hsu ....................... | H05K 7/1407 361/727 |
| 5,796,592 A | * | 8/1998 | Tanaka ................... | H01R 9/096 361/728 |
| 6,086,416 A |   | 7/2000 | Choy | |
| 6,115,260 A | * | 9/2000 | Nakajima .............. | H05K 1/117 174/260 |

(Continued)

FOREIGN PATENT DOCUMENTS

| | | |
|---|---|---|
| CN | 105098408 A | 11/2015 |
| WO | PCT/CN2016/113388 | 12/2016 |

OTHER PUBLICATIONS

English Abstract and Machine Translation for CN105098408A, published on Nov. 25, 2015, Total 20 pp.

(Continued)

*Primary Examiner* — Edwin A. Leon
*Assistant Examiner* — Oscar Jimenez
(74) *Attorney, Agent, or Firm* — Konrad Raynes Davda & Victor LLP; Alan S. Raynes

(57) ABSTRACT

One embodiment relates to a memory module connector comprising a housing defining a stepped slot configured to accept a memory module. Another embodiment includes a memory module defining a stepped slot configured to accept a memory module, and a memory module comprising a printed circuit board and a plurality of components mounted on the printed circuit board, wherein the wherein the stepped slot in the memory module connector is configured so that at least one of the plurality of components mounted on the printed circuit board is positioned in the stepped slot. Other embodiments are described and claimed.

19 Claims, 3 Drawing Sheets

(56) References Cited

U.S. PATENT DOCUMENTS

| | | | |
|---|---|---|---|
| 6,312,279 B1* | 11/2001 | Rachui | H01R 12/89 |
| | | | 439/327 |
| 6,461,169 B1* | 10/2002 | Harrison | H05K 3/366 |
| | | | 439/55 |
| 6,717,823 B2 | 4/2004 | McCall et al. | |
| 7,029,307 B1 | 4/2006 | Ling et al. | |
| 7,458,821 B2 | 12/2008 | Willis et al. | |
| 8,425,237 B2* | 4/2013 | Sass | H01R 12/721 |
| | | | 439/62 |
| 8,529,282 B1* | 9/2013 | Westman | H01R 13/6273 |
| | | | 439/345 |
| 9,128,679 B2* | 9/2015 | McKenney | G06F 1/185 |
| 9,306,304 B2 | 4/2016 | Chen et al. | |
| 9,318,850 B2 | 4/2016 | Li et al. | |
| 9,391,378 B2 | 7/2016 | Leddige et al. | |
| 9,515,402 B1 | 12/2016 | Li et al. | |
| 9,608,364 B2* | 3/2017 | Stock | H01R 13/533 |
| 9,618,983 B2* | 4/2017 | Kim | G06F 1/18 |
| 9,755,334 B2 | 9/2017 | Li et al. | |
| 9,787,028 B2 | 10/2017 | Enriquez-Shibayama et al. | |
| 9,832,876 B2 | 11/2017 | Prakash et al. | |
| 2003/0011391 A1 | 1/2003 | Brunelle et al. | |
| 2006/0042821 A1 | 3/2006 | Pax | |
| 2012/0058650 A1* | 3/2012 | Cha | H01L 23/13 |
| | | | 439/60 |
| 2013/0151745 A1* | 6/2013 | Yin | G06F 1/189 |
| | | | 710/301 |
| 2014/0153194 A1* | 6/2014 | Bahali | H01R 12/721 |
| | | | 361/728 |
| 2015/0031232 A1* | 1/2015 | Kerrigan | H01R 12/7058 |
| | | | 439/366 |
| 2015/0171535 A1 | 6/2015 | Li et al. | |
| 2017/0093059 A1 | 3/2017 | Chen et al. | |
| 2017/0271818 A1 | 9/2017 | Lynch et al. | |
| 2018/0007782 A1 | 1/2018 | Zhang et al. | |

OTHER PUBLICATIONS

International Search Report and Written Opinion, dated Oct. 9, 2017, for International Application No. PCT/CN2016/113388, Total 11 pp.

* cited by examiner

STEPPED SLOT CONNECTOR TO ENABLE LOW HEIGHT PLATFORMS

TECHNICAL FIELD

Embodiments related generally to input/output interfaces used in electronic devices, including connectors used for high density computer platforms.

BACKGROUND

Computer systems often include a board such as a motherboard including input/output interfaces such as connectors (also known as sockets) for coupling devices such as memory cards to the board. Memory cards such as a DIMM (dual inline memory module) may include a plurality of memory chips and other components such as resistors positioned on surfaces thereof. The DIMM card may be formed to include a plurality of electrically conductive fingers extending to a leading edge thereof, for making electrical connections between the card and the connector when the leading edge is inserted into the connector on the board. As computing systems become more complex, the spacing on and above the motherboard is limited.

BRIEF DESCRIPTION OF THE DRAWINGS

Embodiments are described by way of example, with reference to the accompanying drawings, in which like reference numerals may refer to similar elements.

DESCRIPTION OF EMBODIMENTS

References in the specification to "embodiments," "certain embodiments," "an embodiment," etc., indicate that the embodiment described may include a particular feature, structure, or characteristic, but every embodiment may not necessarily include the particular feature, structure, or characteristic. Moreover, such phrases are not necessarily referring to the same embodiment. Certain embodiments relate to connectors used to couple a card to a substrate such as a PCB (printed circuit board), for example, a motherboard. Embodiments include devices and methods.

Certain embodiments relate to connector structures for coupling cards such as memory modules to a board, including the formation of a connector including a stepped structure into which a memory card may be positioned. In certain embodiments, the stepped structure enables at least a portion of certain components mounted on the card to be positioned within the height of the connector. Such a structure enables the card to have a smaller height, creating more space within a computing system.

Figure 1:
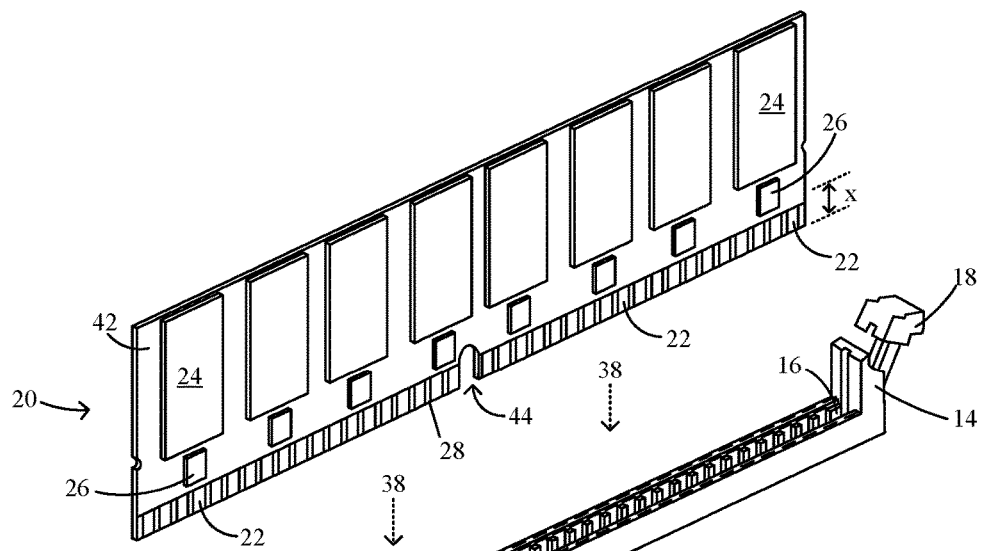
FIG. 1 illustrates a view of a connector and a card for insertion in to the connector, in accordance with certain embodiments.

FIG. 1 illustrates a view of a connector 10 configured to accept and couple a memory card 20 such as a dual in-line memory module (DIMM) to a board. The connector 10 include an elongated housing 12 including tower regions 14 at the end regions. The housing 12 may be configured to surround a central slot 16 that defines a card edge region into which the card 20 may be positioned. The slot 16 of the connector 10 may include a stepped structure, as seen more clearly in the views shown in FIGS. 2-3. The housing 12 may be formed from any suitable material including, but not limited to, a polymer such as a polyamide.

FIG. 1 shows arrows 38 indicating the direction of insertion for the card 20 into the slot 16, with the card edge 28 (the bottom portion of the card 20) being inserted into the slot 16. The connector 10 includes contacts (not shown in FIGS. 1-2) extending into the slot 16 for engaging the fingers 22 on the card. The tower regions 14 may each include an ejector 18 configured to latch onto and eject the card 20.

The memory card 20 may include volatile memory, which may comprise a storage medium that requires power to maintain the state of data stored by the medium. Non-limiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of a memory component may comply with a standard promulgated by Joint Electron Device Engineering Council (JEDEC), such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www.jedec.org).

There are many connector types for coupling cards including memory to a board, including JEDEC DDRx connectors in accordance with standards including, for example, the DDR4 260 Pin SODIMM Connector Performance Standard, and the DDR4 288 Pin U/R/LR DIMM (unregistered/registered/load reduced DIMM) Connector Performance Standard. Such standards (and similar standards) may be referred to as DDR-based standards and communication interfaces of the storage devices that implement such standards may be referred to as DDR-based interfaces.

In certain embodiments, the card 20 comprises a printed circuit board (PCB) 42 including a plurality of components positioned thereon, including, but not limited to, memory chips 24 and resistors 26. The card 20 may include a plurality of electrically conductive fingers 22 formed in the PCB 42 and extending from a position at or near the leading edge 28 of the card 20 and extending up the card 20 a short distance, as illustrated in FIG. 1. The card 20 may also include a key region 44 extending upward from the leading edge.

The region on the card 20 from the leading edge to the bottom edge of the components, for example, the resistors 26 illustrated in FIG. 1, is considered a keep out zone where no components are mounted on the PCB 42. This is so that the leading edge 28 and region adjacent to the leading edge 28 of the card 20 can be inserted into the connector 10 without any of the components mounted on the PCB 42 interfering with the connector 10. Such interference, such as physical contact between the connector 10 and a component (for example, a resistor 26), may lead to the card 20 not being properly positioned in the connector 10 or other problems such as a component or the connector 10 being damaged. In the embodiment illustrated in FIG. 1, the height of the keep out zone is indicated by the letter x.

Figure 2:
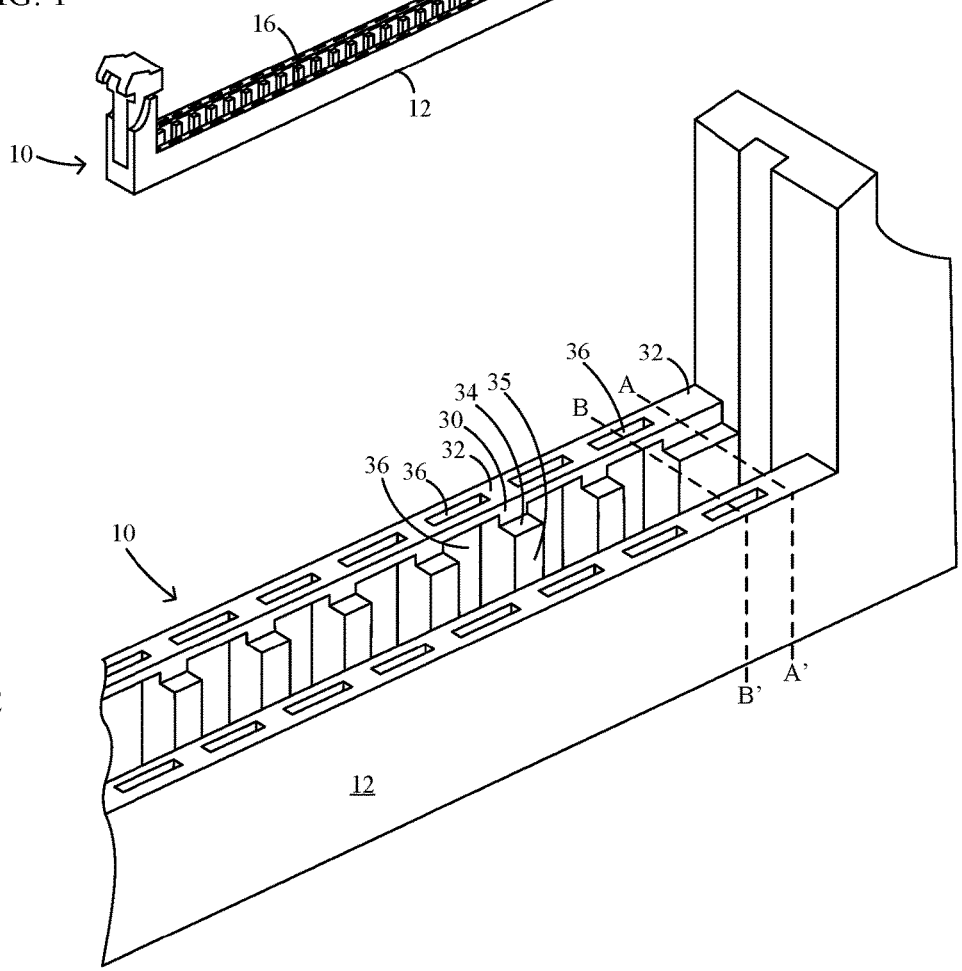
FIG. 2 illustrates certain aspects of a connector in accordance with certain embodiments.

In certain embodiments, by forming the connector 10 to include a stepped structure extending into the slot 16, some or all of certain components on the surface of the card 10 may be positioned within the slot 16 in the connector 10 instead of being fully positioned above and outside of the connector 10. FIG. 2 is a blown up view of certain features on a portion of the connector 10. As noted above, the connector 10 may include a stepped structure extending into the slot 16. As illustrated in FIG. 2, the housing 12 of the connector 10 may define the stepped structure in the slot 16 and includes a first riser portion 30 extending downward from an upper surface portion 32 of the housing 12, a tread portion 34 extending from the riser portion 30, and a second riser portion 35 extending downward from the tread portion 34 towards a bottom portion of the slot 16. FIG. 2 also illustrates contact openings 36 in the housing 12, positioned between adjacent step portions, into which contact structures (not illustrated in FIG. 2) are positioned.

Figure 3:
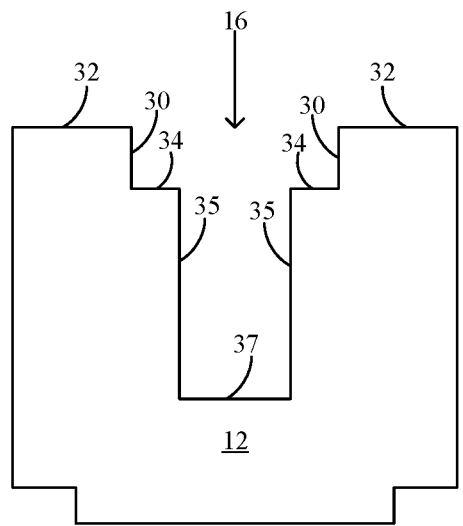
FIG. 3 illustrates certain aspects of a connector prior to card insertion therein, in accordance with certain embodiments.

The stepped structure in the slot 16 defined by the housing 12 is shown in FIG. 3, which illustrates a cross-sectional view along the plane defined by dotted line A-A' in FIG. 2, showing certain features in the connector 10. As described above in connection with FIG. 2, FIG. 3 shows the surface 30, which acts as an upper riser portion of the stepped structure, positioned between the upper surface 32, which acts as an upper tread portion, and the intermediate surface 34, which acts as an intermediate tread portion at a level below that of the upper surface 32. FIG. 3 also illustrates the lower surface 35, which acts as a lower riser portion, extending to the bottom surface 37, which acts as a lower tread portion of the slot 16. In certain embodiments the stepped structure may include the tread portions being parallel to one another, the riser portions parallel to one another, and the riser portions perpendicular to the tread portions. As illustrated in the embodiment illustrated in FIG. 3, both sides of the slot 16 may have the same size and shape of riser and tread surfaces extending from the top to the bottom of the slot 16. In other embodiments, the shape and size of the various surfaces on either side of the slot may be varied from each other, depending, for example, on the structure of the card being inserted into the connector. In addition, the shapes and sizes of the various surfaces defining the slot 16 may vary from those illustrated.

Figure 4:
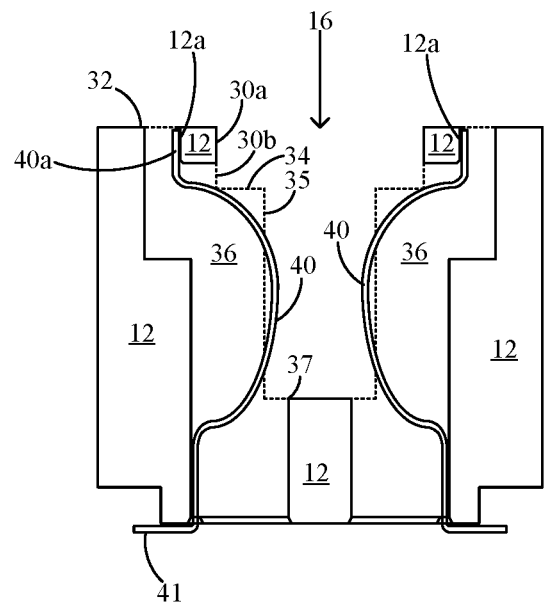
FIG. 4 illustrates the connector of FIG. 3, including contact structures therein, in accordance with certain embodiments.

FIG. 4 illustrates certain features of the connector 10 of FIG. 2, further including contact structures 40, in a cross-sectional view through contact openings 36 along the plane defined by dotted lines B-B' in FIG. 2. Region 30a is a portion of the housing 12 in the slot 16 that extends from the upper surface 32 down into the slot 16 in the plane defined by dotted lines B-B'. The dotted lines in the slot 16 in FIG. 4 illustrate the surfaces defining the slot 16 in a region adjacent to the contact openings 36, including region 30b (dotted line), which is a lower part of the riser portion 30, tread surface 34 (dotted line), and lower riser surface 35 (dotted line) extending to the bottom of the slot 16. In certain embodiments, part of the contact openings 36 may extend to the upper surface 32, as illustrated in FIGS. 2-4. As illustrated in FIGS. 3-4, a lower portion of the slot 16 may be defined by a central portion of the housing 12.

Figure 5:
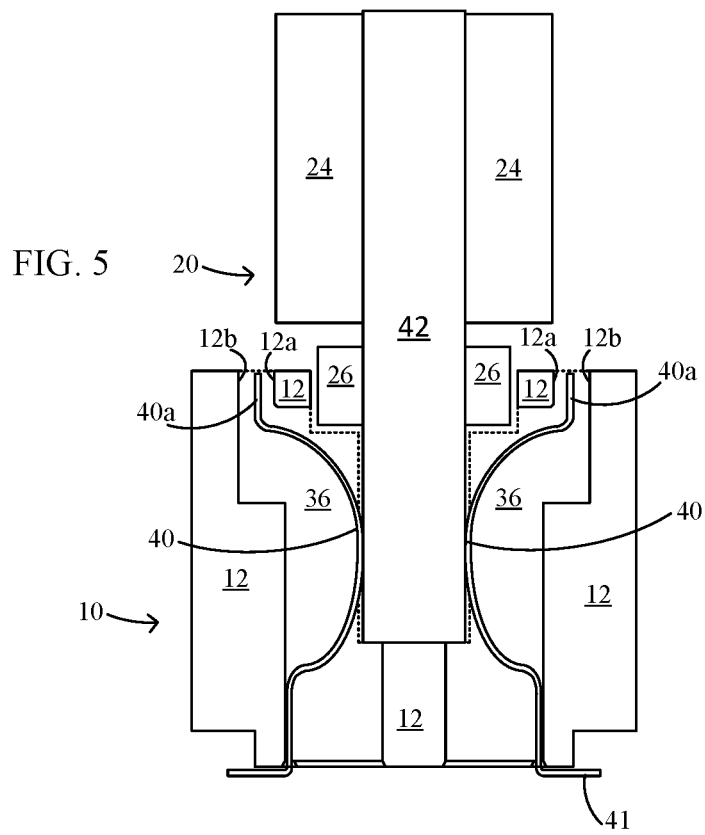
FIG. 5 illustrates the connector of FIG. 4, including a card inserted therein, in accordance with certain embodiments.

FIG. 5 illustrates the connector of FIG. 4, including the memory module card 20 positioned therein. In the illustrated embodiment, a portion of resistor components 26 on both sides of the PCB 42 are positioned within the stepped structure of the slot 16. The contact structures 40 engage the fingers 26 (FIG. 1) to transmit electrical signals to and from the card 20. As seen in the embodiment illustrated in FIG. 5, insertion of the card 20 causes the contact structures 40 to move outwards, with an upper portion 40a being moved from a position engaging the housing 12 along surface 12a (see FIG. 4), to a position between surfaces 12a and 12b of the housing 12, within the contact opening 36. The contact structures 40 as illustrated in FIGS. 4-5 extend to terminal portions 41 that extend from the bottom of the housing 12. The terminals 41 may include solder for coupling to a substrate such as a motherboard. While a surface mount structure is illustrated, embodiments may include a variety of connection structures for coupling to a substrate, including, but not limited to, surface mount, press fit, and through-hole mechanisms.

In certain embodiments, a connector including a stepped structure within the card insertion slot enables the use of a card having a smaller height, with a smaller keep out zone. The card can be formed with a smaller keep out zone because at least some of the components can be positioned closer to the leading edge of the connector and within the stepped region of the slot in the connector. For example, in certain embodiments, the keep out zone extends a distance of about 2.8 mm from the leading edge of the card. In more conventional connector and card structures, a keep out zone distance of, for example, 4 mm, may be utilized because no portion of the components mounted on the card are positioned within the slot in the connector. Accordingly, the use of a connector in accordance with certain embodiments enables a card having a height that is about 1.2 mm less than a conventional card height in which no portion of the components on the card are positioned within the slot in the connector.

Figure 6:
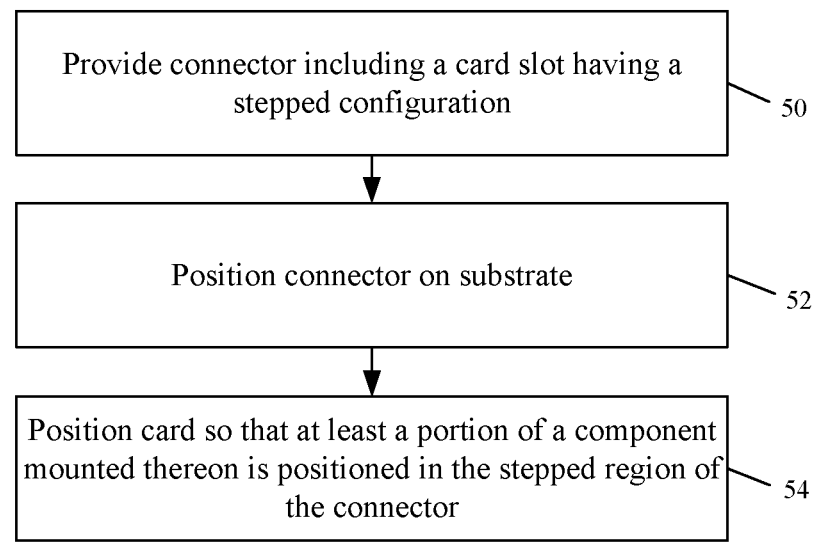
FIG. 6 illustrates a flowchart of operations, in accordance with certain embodiments.

Embodiments also include methods for processing a device including positioning one or more connectors on a substrate. FIG. 6 illustrates a flowchart of operations in accordance with certain embodiments including the formation of a PCB for use in computing systems. Block 50 is providing a connector including a structure including a card slot having a stepped configuration into which at least a portion of a component on a card may be positioned. Block 52 is coupling the connector to a substrate such as a motherboard. The connector may be coupled using any suitable connection mechanism, including, but not limited to, a solder connection. Block 54 is positioning a card such as a DIMM into the connector so that at least a portion of a component on the card is positioned within the stepped configuration of the connector. Depending on the size of the component and the slot, either part of a component or an entire component may fit below the vertical level of the upper surface of the housing that defines the upper end of the stepped slot.

Figure 7:
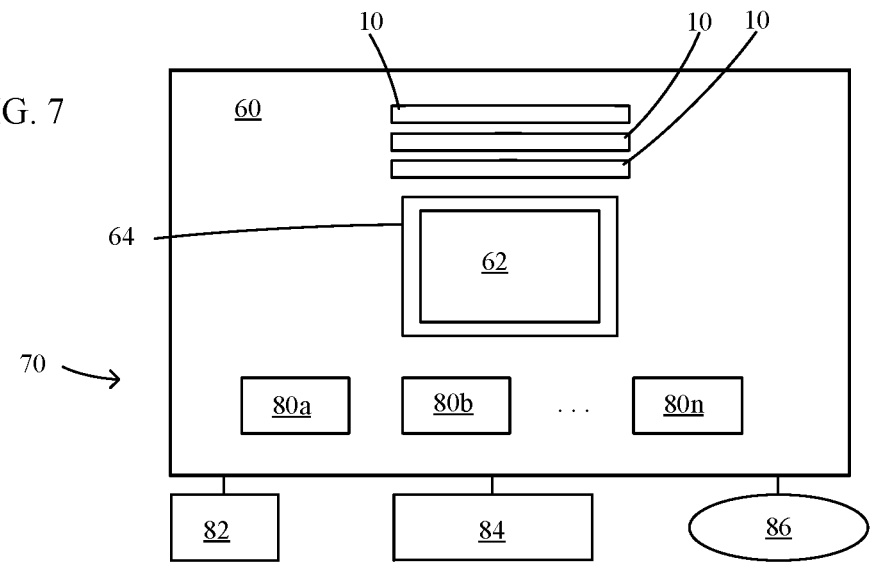
FIG. 7 illustrates an electronic system, in accordance with certain embodiments.

Assemblies including components formed as described in embodiments above may find application in a variety of electronic components. FIG. 7 schematically illustrates one example of an electronic system environment in which aspects of described embodiments may be embodied. Other embodiments need not include all of the features specified in FIG. 7, and may include alternative features not specified in FIG. 6. The system 70 of FIG. 7 may include at least one die such as a CPU 62 positioned in a package substrate 64, which is then coupled to a substrate such as a printed circuit board (PCB) 60.

The system 70 as illustrated in FIG. 7 includes three connectors 10 that include stepped slots to accept cards therein. The connectors may be used to couple memory such as DIMMs to the PCB 60. While FIG. 7 illustrates three connectors 10, other numbers of connectors and other components are possible. The connectors 10 may be configured and formed in accordance with embodiments such as described above, including, for example, a slot having a stepped structure into which at least a portion of a component such as a resistor mounted on a card may be positioned.

The system 70 may further include one or more controllers 80a, 80b . . . 80n, for a variety of components, which may also be disposed on the PCB 60. The system 70 may be formed with additional components, including, but not limited to, storage 82, display 84, and network connection 86. The system 70 may comprise any suitable computing device, including, but not limited to, a mainframe, server, personal computer, workstation, laptop, tablet, netbook, handheld computer, handheld gaming device, handheld entertainment device (for example, MP3 (moving picture experts group layer-3 audio) player), PDA (personal digital assistant), watch, fitness device, smart phone or other telephony device (wireless or wired), network appliance, virtualization device, storage controller, network controller, router, etc.

Various features of embodiments described above may be implemented with respect to other embodiments, including apparatus and method embodiments. The order of certain operations as set forth in embodiments may also be modified. Specifics in the examples may be used anywhere in one or more embodiments.

In the present description, various features are grouped together for the purpose of streamlining the disclosure. This method of disclosure is not to be interpreted as reflecting an intention that the claimed embodiments of the invention require more features than are expressly recited in each claim. Rather, as the claims reflect, inventive subject matter may lie in less than all features of a single disclosed embodiment. Thus the claims are hereby incorporated into the Detailed Description, with each claim standing on its own as a separate embodiment.

While certain exemplary embodiments are described herein and shown in the accompanying drawings, it is to be understood that such embodiments are merely illustrative and not restrictive, and that embodiments are not restricted to the specific constructions and arrangements shown and described since modifications may occur to those having ordinary skill in the art. For example, in certain embodiments the morphology of the housing 12 and the surfaces of the slot 16 may differ from those illustrated in the figures and described above.

The terms "a" and "an" mean "one or more", unless expressly specified otherwise. Terms such as "first", "second", and the like may be used herein and do not necessarily denote any particular order, quantity, or importance, but are used to distinguish one element from another. Terms such as "upper", "lower", "top", "bottom", and the like may be used for descriptive purposes only and are not to be construed as limiting.

Devices that are in communication with each other need not be in continuous communication with each other, unless expressly specified otherwise. In addition, devices that are in communication with each other may communicate directly or indirectly through one or more intermediaries. A description of an embodiment with several components in communication with each other does not imply that all such components are required. Embodiments may be manufactured, used, and contained in a variety of positions and orientations.

The foregoing description of various embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

EXAMPLES

The following examples pertain to various embodiments. Specifics in the Examples may be used anywhere in one or more embodiments.

Example 1 is a memory module connector comprising a housing defining a stepped slot configured to accept a memory module.

In Example 2, the subject matter of Example 1 can optionally include wherein the stepped slot is sized to accommodate at least a portion of a component mounted on the memory module.

In Example 3, the subject matter of any one of Examples 1-2 can optionally include wherein the housing includes an upper surface defining a first tread portion, an intermediate surface defining a second tread portion, a first riser portion extending between the first tread portion and the second tread portion, a third tread portion defining a lower surface in the stepped slot, and a second riser portion extending from the second tread portion to the third tread portion.

In Example 4, the subject matter of Example 3 can optionally include wherein the first tread portion is parallel to the second tread portion.

In Example, 5, the subject matter of any one of Examples 3-4 can optionally include wherein the third tread portion is parallel to the first tread portion and the second tread portion.

In Example 6, the subject matter of any one of Examples 3-5 can optionally include wherein the first riser portion is parallel to the second riser portion.

In Example, 7, the subject matter of any one of Examples 3-6 can optionally include wherein the first tread portion is perpendicular to the first riser portion.

In Example, 8, the subject matter of any one of Examples 3-7 can optionally include wherein the first tread portion is perpendicular to the first riser portion, wherein the second tread portion of perpendicular to the second riser portion, and wherein the third tread portion is perpendicular to the second riser portion.

Example 9 is an apparatus comprising the memory module connector of any of Examples 1-8; and a memory module comprising a printed circuit board and a plurality of components mounted on the printed circuit board; wherein the stepped slot in the memory module connector is configured so that at least one component of the plurality of components mounted on the printed circuit board is positioned in the stepped slot.

In Example 10, the subject matter of Example 9 can optionally include wherein the plurality of components comprises memory chips and resistors.

In Example 11, the subject matter of any one of Examples 9-10 can optionally include wherein the at least one component positioned in the stepped slot comprises a resistor.

In Example 12, the subject matter of any one of Examples 9-11 can optionally include wherein the memory chips comprise dynamic random access memory (DRAM) chips.

In Example 13, the subject matter of any one of Examples 9-12 can optionally include the connector comprising a housing, wherein the stepped slot includes an upper end defined by an upper surface of the housing, wherein each component of the at least one component positioned in the stepped slot includes a first portion positioned below the upper end of the stepped slot and a second portion positioned above the upper end of the stepped slot.

Example 14 is a connector comprising a housing including surfaces defining a card edge region, the surfaces comprising a stepped structure comprising an upper tread portion, an intermediate tread portion, an upper riser portion between the upper tread portion and the intermediate tread portion, a lower tread portion, and a lower riser portion positioned between the intermediate tread portion and the lower tread portion.

Example 15 is an apparatus including the subject matter of Example 14, further comprising a memory card positioned in the card edge region, the memory card including a component mounted on a printed circuit board, the component being positioned so that at least a portion of the component is positioned between the printed circuit board and the upper riser portion in the card edge region.

In Example 16, the subject matter of Example 15 can optionally include wherein a portion of the component is positioned at a vertical level below that of the upper tread portion.

In Example 17, the subject matter of any one of Examples 15-16 can optionally include wherein the component in its entirety is positioned at a vertical level below that of the upper tread portion.

In Example 18, the subject matter of any one of Examples 15-17 can optionally include wherein the component comprises a resistor, and wherein the memory card further comprises a plurality of memory chips and resistors mounted on the printed circuit board.

In Example 19, the subject matter of any one of Examples 15-18 can optionally include wherein the component comprises a resistor.

In Example 20, the subject matter of Example 18 can optionally include wherein the memory chips comprise dynamic random access memory (DRAM) chips.

In Example 21, the subject matter of any one of Examples 14-20 can optionally include wherein the upper tread portion is parallel to the intermediate tread portion.

In Example 22, the subject matter of any one of Examples 14-21 can optionally include wherein the lower tread portion is parallel to the upper tread portion and the intermediate tread portion.

In Example 23, the subject matter of any one of Examples 14-22 can optionally include wherein the upper riser portion is parallel to the lower riser portion.

In Example 24, the subject matter of any one of Examples 14-23 can optionally include wherein the upper portion is perpendicular to the upper riser portion.

In Example 25, the subject matter of any one of Examples 14-24 can optionally include wherein the upper tread portion is perpendicular to the upper riser portion, wherein the intermediate tread portion of perpendicular to the intermediate riser portion, and wherein the lower tread portion is perpendicular to the intermediate riser portion.

Example 26 is a method comprising: providing a memory module comprising a printed circuit board and a plurality of components mounted on the printed circuit board; providing a connector including a stepped slot configured to accept the memory module; and positioning the memory module in the connector so that at least one of the components mounted on the printed circuit board is positioned in the slot.

In Example 27, the subject matter of Example 26 can optionally include wherein each component of the at least one of the components positioned in the stepped slot is positioned so that a first surface is below an upper end of the stepped slot that is defined by an upper surface of the memory module, and a second surface is above the upper end of the stepped slot.

In Example 28, the subject matter of any one of Examples 26-27 can optionally include the memory module comprising a housing defining a stepped slot structure comprising an upper tread portion, an intermediate tread portion, an upper riser portion between the upper tread portion and the intermediate tread portion, a lower tread portion, and a lower riser portion positioned between the intermediate tread portion and the lower tread portion, and positioning each component of the at least one of the components positioned in the stepped slot so that the component is positioned between the printed circuit board and the upper riser portion.

In Example 29, the subject matter of any one of Examples 26-28 can optionally include wherein the plurality of components include a plurality of memory chips and a plurality of resistors, and wherein at least some of the plurality of resistors are positioned in the stepped slot.

Example 30 is an apparatus comprising means to perform a method as described in any preceding Example.

What is claimed:

1. An apparatus comprising:
   a memory module connector comprising a housing defining a stepped slot configured to accept a memory module;
   the memory module comprising a printed circuit board and a plurality of components mounted on the printed circuit board;
   wherein the stepped slot in the memory module connector is configured so that at least one component of the plurality of components mounted on the printed circuit board is positioned in the stepped slot; and
   wherein the stepped slot includes an upper end defined by an upper surface of the housing, wherein each component of the at least one component positioned in the stepped slot includes a first portion positioned below the upper end of the stepped slot and a second portion positioned above the upper end of the stepped slot.

2. The apparatus of claim 1, wherein the housing includes the upper surface defining a first tread portion, an intermediate surface defining a second tread portion, a first riser portion extending between the first tread portion and the second tread portion, a third tread portion defining a lower surface in the stepped slot, and a second riser portion extending from the second tread portion to the third tread portion.

3. The apparatus of claim 2, wherein the first tread portion is parallel to the second tread portion.

4. The apparatus of claim 2, wherein the first tread portion is perpendicular to the first riser portion, wherein the second tread portion is perpendicular to the second riser portion, and wherein the third tread portion is perpendicular to the second riser portion.

5. The apparatus of claim 1, wherein the plurality of components comprises memory chips and resistors.

6. The apparatus of claim 5, wherein the memory chips comprise dynamic random access memory (DRAM) chips.

7. The apparatus of claim 1, wherein the at least one component positioned in the stepped slot comprises a resistor.

8. A method comprising:
   providing a memory module comprising a printed circuit board and a plurality of components mounted on the printed circuit board;
   providing a connector including a stepped slot configured to accept the memory module; and
   positioning the memory module in the connector so that at least one of the components mounted on the printed circuit board is positioned in the stepped slot;
   wherein each component of the at least one of the components positioned in the stepped slot is positioned so that a first surface is below an upper end of the stepped slot that is defined by an upper surface of the memory module, and a second surface is above the upper end of the stepped slot.

9. The method of claim 8, the memory module comprising a housing defining a stepped slot structure comprising an upper tread portion, an intermediate tread portion, an upper riser portion between the upper tread portion and the intermediate tread portion, a lower tread portion, and a lower riser portion positioned between the intermediate tread portion and the lower tread portion, and positioning each component of the at least one of the components positioned in the stepped slot so that the component is positioned between the printed circuit board and the upper riser portion.

10. The method of claim 8, wherein the components are selected from the group consisting of memory chips and resistors.

11. The method of claim 8, wherein the components comprise resistors.

12. A memory module connector comprising: tower regions separated by a central region; the tower regions each including an upper surface positioned at a height greater than an upper surface of the central region; the central region including first and second elongated sides and a slot therebetween into which a memory module can be positioned, the slot including a stepped structure having a greater width at an upper portion thereof than at a lower portion thereof; and a plurality of contact structures positioned along the first and second elongated sides and facing the slot, the contact structures positioned in a single row along the first elongated side and in a single row along the second elongated side; wherein the slot is defined at least in part by an upper tread portion, an intermediate tread portion, an upper riser portion between the upper tread portion and the intermediate tread portion, and a lower riser portion, the intermediate tread portion positioned between the upper tread portion and the lower riser portion.

13. The memory module connector of claim 12, wherein the upper tread portion is perpendicular to the upper riser portion and parallel to the intermediate tread portion.

14. An assembly including the memory module connector of claim 12 and a memory module, wherein the memory module includes a plurality of components mounted thereon, wherein at least one of the components is positioned so that at least a portion of the component is located below an upper end of the slot.

15. An assembly including the memory module connector of claim 12 and a memory module, wherein the memory module includes a plurality of components mounted thereon, wherein at least one of the components is positioned so that a first portion of the component is located below an upper end of the slot and a second portion of the component is positioned above the upper end of the slot.

16. The assembly of claim 15, wherein the components comprise at least one component selected from the group consisting of memory chips and resistors.

17. The assembly of claim 16, wherein the components comprise at least one component selected from the group consisting of memory chips and resistors.

18. The assembly of claim 16, wherein the at least one of the components comprises a resistor.

19. The assembly of claim 15, wherein the at least one of the components comprises a resistor.

\* \* \* \* \*